(12) United States Patent
Krishnamurthy et al.

(10) Patent No.: US 7,206,947 B2
(45) Date of Patent: Apr. 17, 2007

(54) SYSTEM AND METHOD FOR PROVIDING A PERSISTENT POWER MASK

(75) Inventors: Viswanath Krishnamurthy, Sunnyvale, CA (US); Daniel Delfatti, Belmont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 524 days.

(21) Appl. No.: 10/693,710

(22) Filed: Oct. 23, 2003

(65) Prior Publication Data

US 2004/0133819 A1 Jul. 8, 2004

Related U.S. Application Data

(60) Provisional application No. 60/420,923, filed on Oct. 24, 2002.

(51) Int. Cl.
*G06F 11/00* (2006.01)

(52) U.S. Cl. ............... 713/320; 713/321; 713/322; 713/323; 713/324; 714/6; 714/11; 714/13

(58) Field of Classification Search ........ 713/320–324; 714/6, 11, 13
See application file for complete search history.

(56) References Cited

U.S. PATENT DOCUMENTS

| 5,253,184 | A | 10/1993 | Kleinschnitz |
| 6,262,493 | B1 | 7/2001 | Garnett |
| 6,341,068 | B1 | 1/2002 | Bradley |
| 6,363,493 | B1 | 3/2002 | Williams |
| 6,744,628 | B2 | 6/2004 | Olesiewicz |
| 6,901,344 | B2* | 5/2005 | Mantey et al. ............ 702/122 |
| 6,957,353 | B2* | 10/2005 | Bresniker et al. .......... 713/320 |
| 6,968,470 | B2* | 11/2005 | Larson et al. ............. 713/340 |
| 6,970,948 | B2* | 11/2005 | Brown et al. .............. 710/8 |
| 7,043,650 | B2* | 5/2006 | Bresniker et al. .......... 713/324 |
| 2002/0112191 | A1* | 8/2002 | Pelissier et al. ........... 713/300 |

OTHER PUBLICATIONS

International search report application No. 03256692.9 mailed Aug. 31, 2006.
"IPMI—Intelligent Platform Management Interface Specification Passage", IPMI, *Intelligent Platform Management Interface Specification*, XX, XX, No. version 15, Feb. 20, 2002, XP002346263.

* cited by examiner

*Primary Examiner*—A. Elamin
(74) *Attorney, Agent, or Firm*—Meyertons Hood Kivlin Kowert & Goetzel, P.C.; B. Noël Kivlin

(57) ABSTRACT

A system and method is provided to allow a computer network system to keep a device in a powered off state over a power cycle. A service processor stores the power state information or power mask corresponding to the field replaceable unit (FRU) slots in a non-volatile storage location. As a result, after the system has been powered off and on, the power mask information is retained. Accordingly, a hotswap controller may then retrieve the power mask from storage to determine whether a given FRU should be powered on or kept in a powered off state. Depending on the power mask, the service processor will not power on the FRU if the power mask indicates that the device should remain in a powered off state. A management entity may update the power mask information depending on predetermined parameters or the condition of the FRU. As a result, a power mask may be maintained for several power cycles to keep a device in a powered off state.

25 Claims, 7 Drawing Sheets

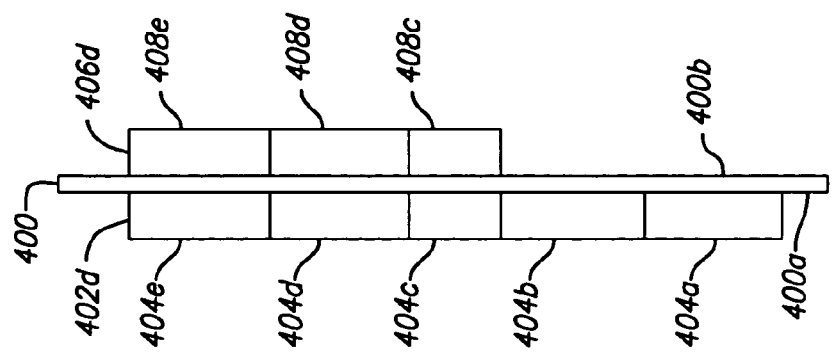
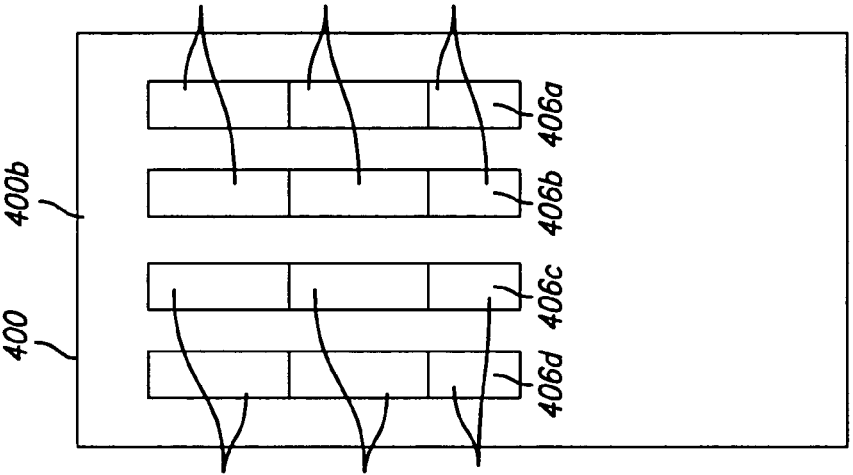
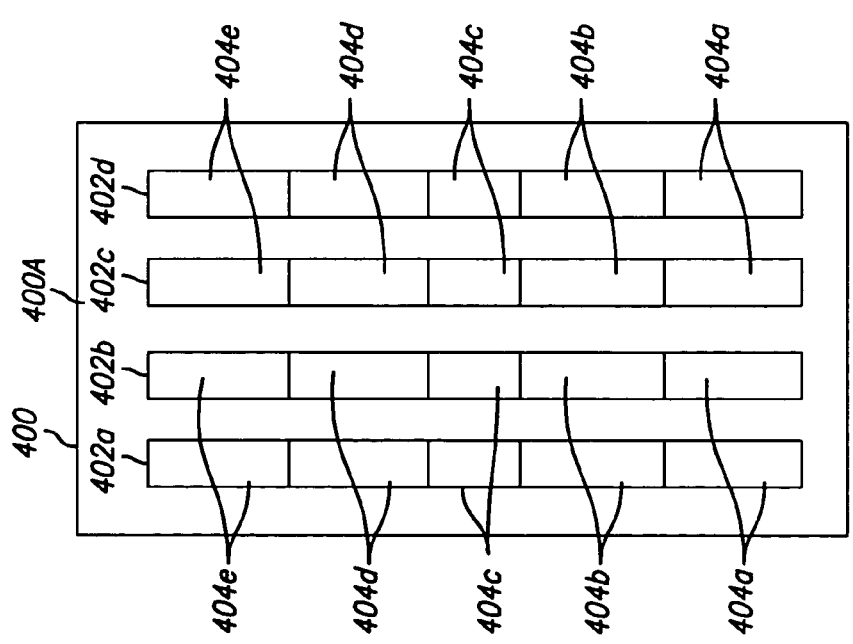

SYSTEM AND METHOD FOR PROVIDING A PERSISTENT POWER MASK

RELATED APPLICATION DATA

This application claims priority pursuant to 35 U.S.C. §119(e) to U.S. Provisional Application No. 60/420,923, filed Oct. 24, 2002, for SYSTEM AND METHOD FOR PROVIDING A PERSISTENT POWER MASK.

BACKGROUND OF THE INVENTION

1. Field of the Invention

The present invention relates to the field of computer systems and, in particular, to controlling the power states of computer system devices.

2. Background

Highly available (HA) computer networks are used in applications in which uptime must be maximized. HA computer networks generally utilize redundant systems in which functionality is duplicated so that if one component fails, other devices may be used. For HA computer networks, such as HA Compact Peripheral Component Interconnect (CPCI or cPCI) systems, it is desirable to control the power state of an attached device or field replaceable unit (FRU). For example, a faulty FRU may affect the entire system unless it is powered off. In another example, a user may plug in an FRU that consumes more power than the system can afford. In this event, it would be desirable to prevent this device from powering on in order to preserve the uptime of the HA network. Unfortunately, conventional systems do not allow a system to keep a device powered off over several power cycles, e.g., as the system is powered on and off again. As a result, faulty devices or devices that require too much power may be powered on and adversely affect the uptime of the HA network. Accordingly, there is a need to hold a network device powered off over a power cycle.

SUMMARY OF THE INVENTION

The present invention provides a system and method to allow a computer network to keep a device in a powered off state over a power cycle. A service processor stores the power state information or power mask corresponding to the field replaceable unit (FRU) slots in a non-volatile storage location. As a result, after the system has been powered off and on, the power mask information is retained. Accordingly, a hotswap controller may then retrieve the power mask from storage to determine whether a given FRU should be powered on or kept in a powered off state. Depending on the power mask, the service processor will not power on the FRU if the power mask indicates that the device should remain in a powered off state. A management entity may update the power mask information depending on predetermined parameters or the condition of the FRU. As a result, a power mask may be maintained for several power cycles to keep a device in a powered off state.

In one embodiment, a computer network system includes a circuit board that forms a backplane. An FRU slot is located on the backplane. The computer network system also includes a bus. A central resource is coupled with the FRU slot via the bus. A non-volatile memory is coupled to the central resource. The central resource generates a power mask for the FRU slot. The generated power mask is stored in the non-volatile memory. The power mask includes a power state of the FRU slot.

In another embodiment, a method for generating and utilizing a persistent power mask to determine the power state of a computer network device is provided. The method includes determining by a central resource whether an FRU coupled to a computer network system should be powered off during a first power cycle of the computer network system. A power mask is then generated by the central resource for the FRU to reflect a power state (e.g., a power status) determined by the central resource for the FRU. The generated power mask is stored in a non-volatile memory. The central resource then accesses the power mask from the non-volatile memory during a second power cycle of the computer network system and utilizes this power mask to determine whether the FRU should be persistently powered off during the second power cycle.

A more complete understanding of the system and method for providing a persistent power mask will be afforded to those skilled in the art, as well as a realization of additional advantages and objects thereof, by a consideration of the following detailed description of the preferred embodiments. Reference will be made to the appended sheets of drawings which will first be described briefly.

BRIEF DESCRIPTION OF THE DRAWINGS

The drawings illustrate the design and utility of preferred embodiments of the invention. The components in the drawings are not necessarily to scale, emphasis instead being placed upon illustrating the principles underlying the embodiment. Moreover, in the drawings like reference numerals designate corresponding parts throughout the different views.

FIG. 4(a) shows a front view of another CPCI backplane;

FIG. 4(b) shows a back view of the backplane of FIG. 4(a);

FIG. 5 shows a side view of the backplane of FIGS. 4(a) and 4(b);

DETAILED DESCRIPTION

The present invention provides a system and method for providing a persistent power mask to hold a network device in a powered off state over several power cycles. In the following detailed description, like element numerals are used to describe like elements illustrated in one or more drawings.

Figure 1:
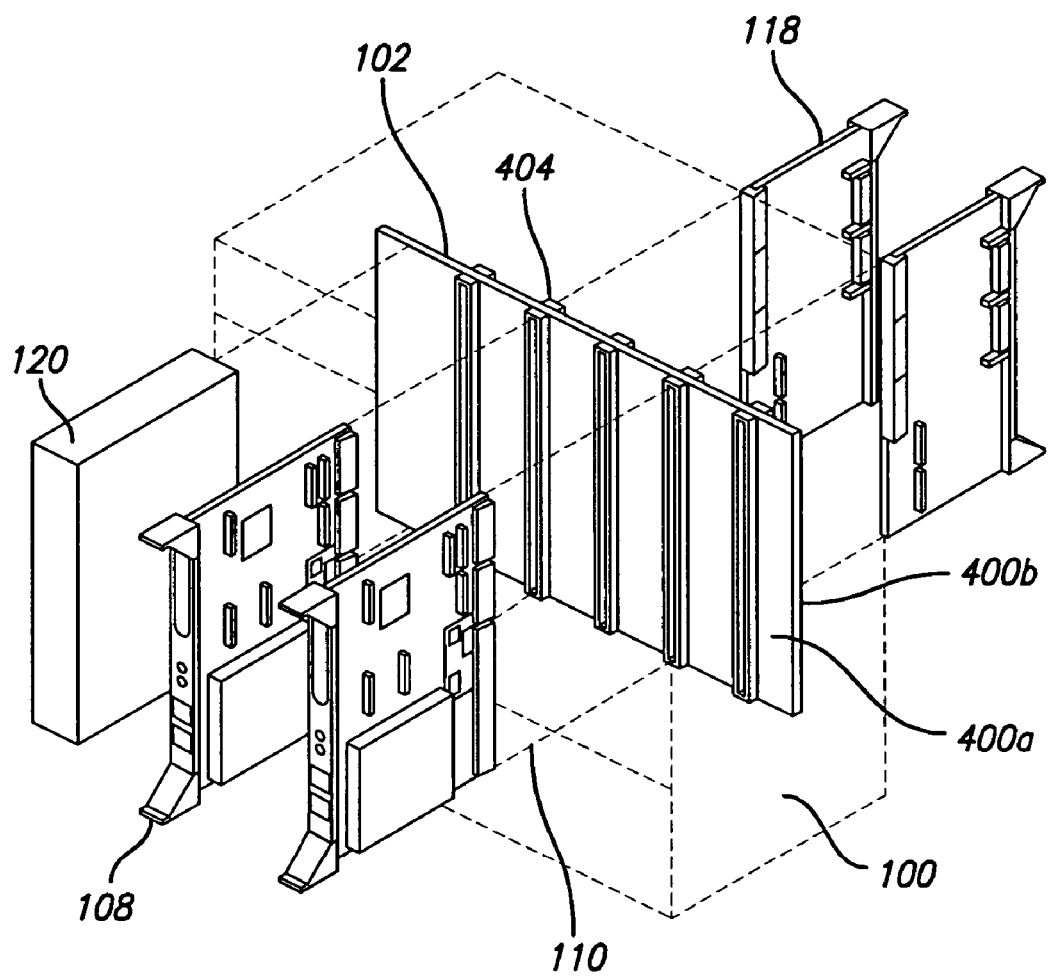
FIG. 1 is an exploded perspective view of a Compact Peripheral Component Interconnect (CPCI) chassis system according to an exemplary embodiment.

Referring to FIG. 1, there is shown an exploded perspective view of a Compact Peripheral Component Interconnect (CPCI) chassis system as envisioned in an exemplary embodiment. The chassis system 100 includes a CPCI circuit board referred to in the conventional CPCI system as a passive backplane (or centerplane or midplane) 102 since the circuit board is located at the back of the chassis 100 and node or front cards (e.g., motherboards) are inserted from the front of the chassis 100. The front side 400a of the backplane 102 has slots provided with connectors 404. A corresponding transition card 118 is coupled to the front card 108 via backplane 102. The backplane 102 contains corresponding slots and connectors (not shown) on its backside 400b to mate with transition card 118. In the chassis system 100 that is shown, a front card 108 may be inserted into appropriate slots and mated with the connectors 404. For proper insertion of the front card 108 into the slot, card guides 110 are provided. This CPCI chassis system 100 provides front removable front cards and unobstructed cooling across the entire set of front cards. The backplane 102 is also connected to a power supply 120 that supplies power to the CPCI system.

Figure 2:
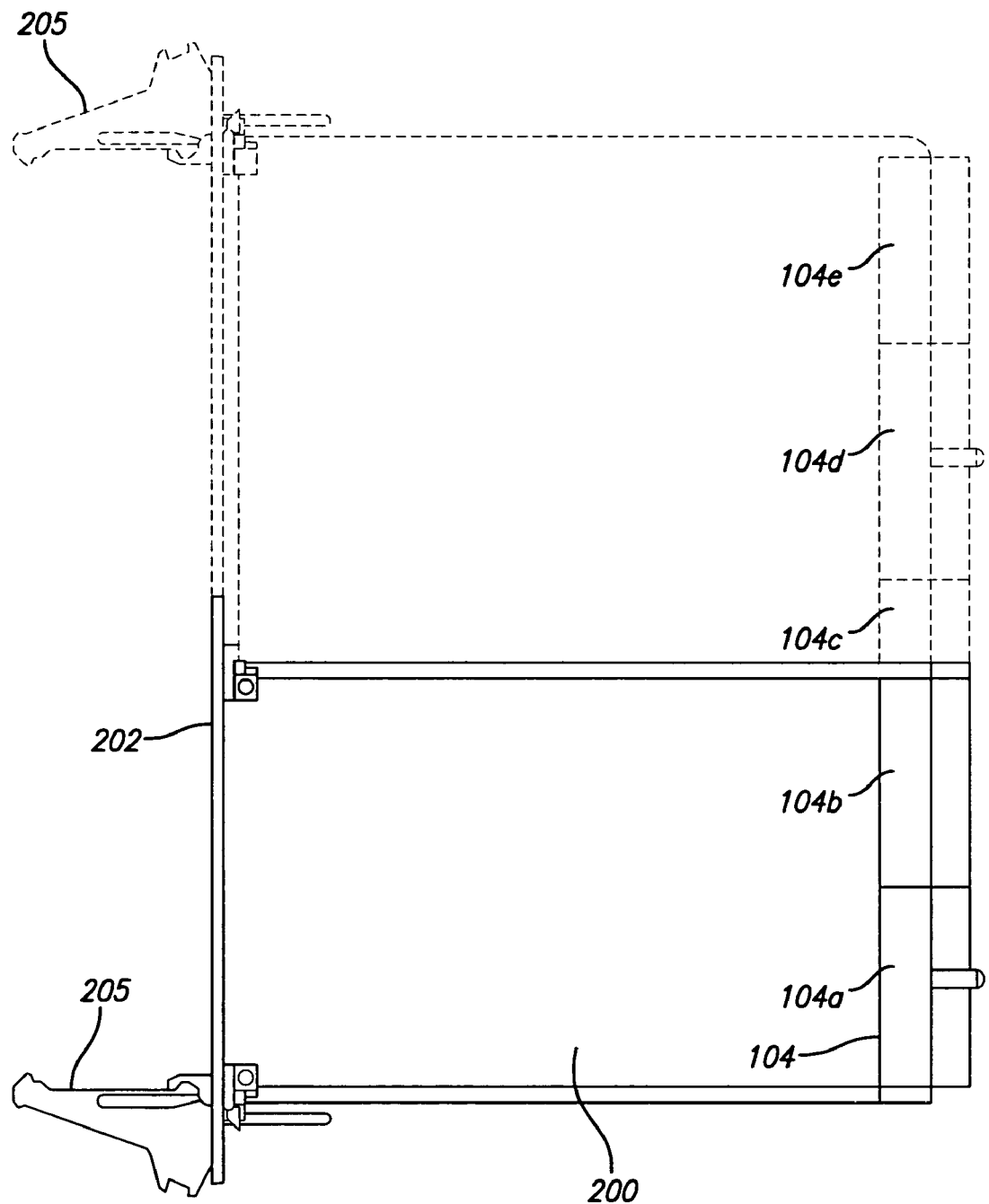
FIG. 2 shows the form factors that are defined for the CPCI node card.

Referring to FIG. 2, there are shown the form factors defined for the CPCI front card, which is based on the PICMG CPCI industry standard (e.g., the standard in the PICMG 2.0 CPCI specification). As shown in FIG. 2, the front card 200 has a front plate interface 202 and ejector/injector handles 205. The front plate interface 202 is consistent with PICMG CPCI packaging and is compliant with IEEE 1101.1 or IEEE 1101.10. The ejector/injector handles should also be compliant with IEEE 1101.1. Two ejector/injector handles 205 are used for the 6U front cards in the present embodiment. The connectors 104a–104e of the front card 200 are numbered starting from the bottom connector 104a, and the 6U front card size is defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b and is the minimum as it accommodates the full 64 bit CPCI bus. Specifically, the 104a connectors are reserved to carry the signals required to support the 32-bit PCI bus; hence no other signals may be carried in any of the pins of this connector. Optionally, the 104a connectors may have a reserved key area that can be provided with a connector "key," which may be a pluggable piece (e.g., a pluggable plastic piece) that comes in different shapes and sizes, to restrict the add-on card to mate with an appropriately keyed slot. The 104b connectors are defined to facilitate 64-bit transfers or for rear panel I/O in the 3U form factor. The 104c–104e connectors are available for 6U systems as also shown in FIG. 2. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (i.e., Signal Computing System Architecture (SCSA) or MultiVendor Integration Protocol (MVIP) telephony buses), bridges to other buses (i.e., Virtual Machine Environment (VME) or Small Computer System Interface (SCSI)), or for user specific applications. Note that the CPCI specification defines the locations for all of the connectors 104a–104e, but only the signal-pin assignments for certain connectors are defined (e.g., the CPCI bus portion 104a and 104b are defined). The remaining connectors are the subjects of additional specification efforts or can be user defined for specific applications, as described above.

Figure 3:
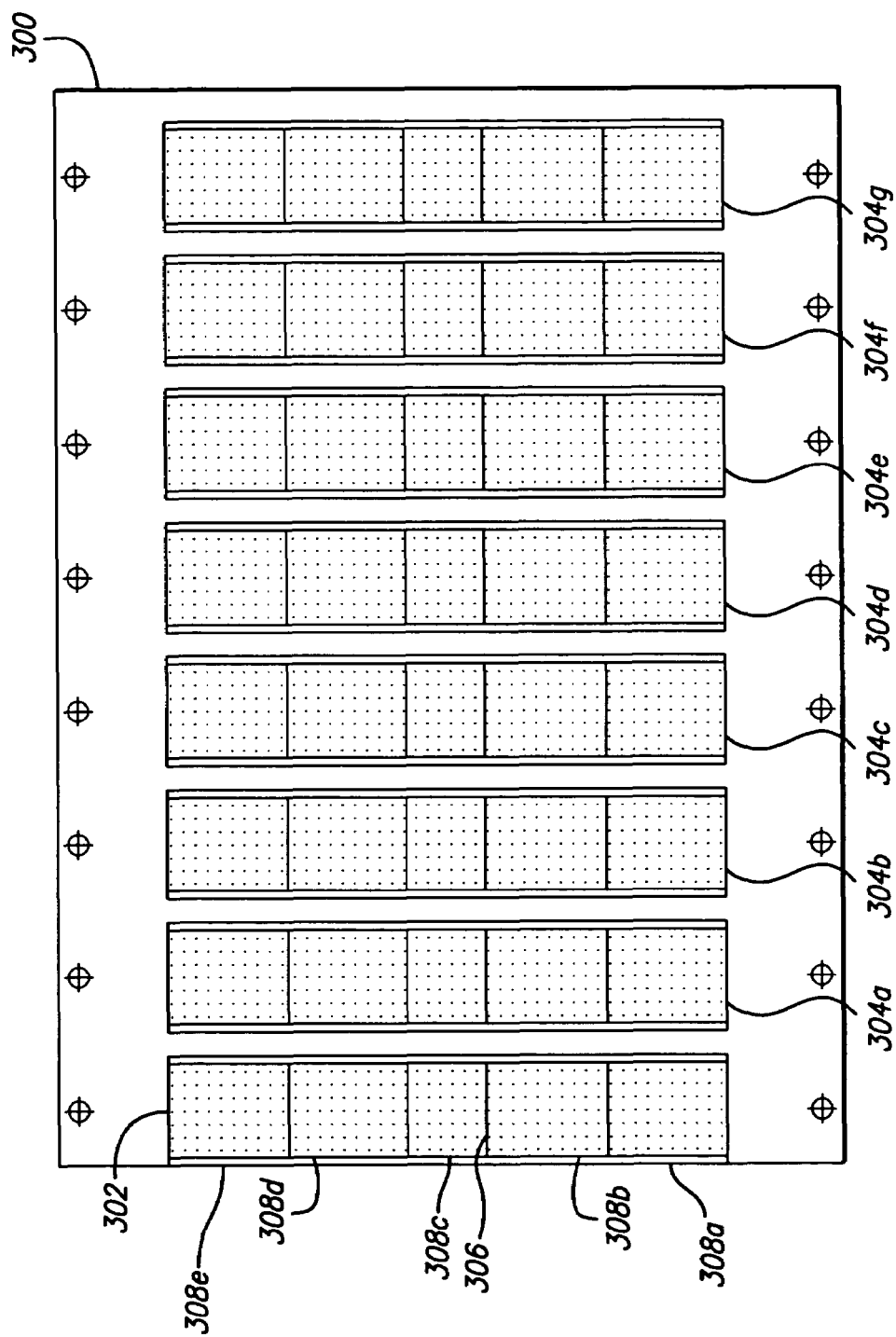
FIG. 3 is a front view of a backplane having eight slots with five connectors each.

Referring to FIG. 3, there is shown a front view of a 6U backplane having eight slots. A CPCI system includes one or more CPCI bus segments, where each bus segment typically includes up to eight CPCI card slots. Each CPCI bus segment includes at least one system slot 302 and up to seven peripheral slots 304a–304g. The CPCI front card for the system slot 302 provides arbitration, clock distribution, and reset functions for the CPCI peripheral cards on the bus segment. The peripheral slots 304a–304g may contain simple cards, intelligent slaves and/or PCI bus masters.

The connectors 308a–308e have connector-pins 306 that project in a direction perpendicular to the backplane 300, and are designed to mate with the front side "active" cards ("front cards"), and "pass-through" its relevant interconnect signals to mate with the rear side "passive" input/output (I/O) card(s) ("rear transition cards"). In other words, in the conventional CPCI system, the connector-pins 306 allow the interconnected signals to pass-through from the front cards, such as the motherboards, to the rear transition cards.

Referring to FIGS. 4(a) and 4(b), there are shown respectively a front and back view of a CPCI backplane in another 6U form factor embodiment. In FIG. 4(a), four slots 402a–402d are provided on the front side 400a of the backplane 400. In FIG. 4(b), four slots 406a–406d are provided on the back side 400b of the backplane 400. Note that in both FIGS. 4(a) and 4(b) four slots are shown instead of eight slots as in FIG. 3 . Further, it is important to note that each of the slots 402a–402d on the front side 400a has five connectors 404a–404e while each of the slots 406a–406d on the back side 400b has three connectors 408c–408e. This is because the 404a connectors are provided for 32 bit PCI and connector keying and the 404b connectors are typically only for I/O in the 3U form factor. Thus, in the 6U form factor they do not typically have I/O connectors to their rear. Accordingly, the front cards that are inserted in the front side slots 402a–402d only transmit signals to the rear transition cards that are inserted in the back side slots 406a–406d through front side connectors 404c–404e.

Referring to FIG. 5, there is shown a side view of the backplane of FIGS. 4(a) and 4(b). As shown in FIG. 5, slot 402d on the front side 400a and slot 406d on the back side 400b are arranged to be substantially aligned so as to be back to back. Further, slot 402c on the front side 400a and slot 406c on the backside 400b are arranged to be substantially aligned, and so on. Accordingly, the front side connectors 404c–404e are arranged back-to-back with the back side connectors 408c–408e. Note that the front side connector 404a–404b does not have a corresponding back side connector. It is important to note that the system slot 402a is adapted to receive the front card having a CPU; the signals from the system slot 402a are then transmitted to corresponding connector-pins of the peripheral slots 402b–402d. Thus, the preferred CPCI system can have expanded I/O functionality by adding peripheral front cards in the peripheral slots 402b–402d.

Figure 6:
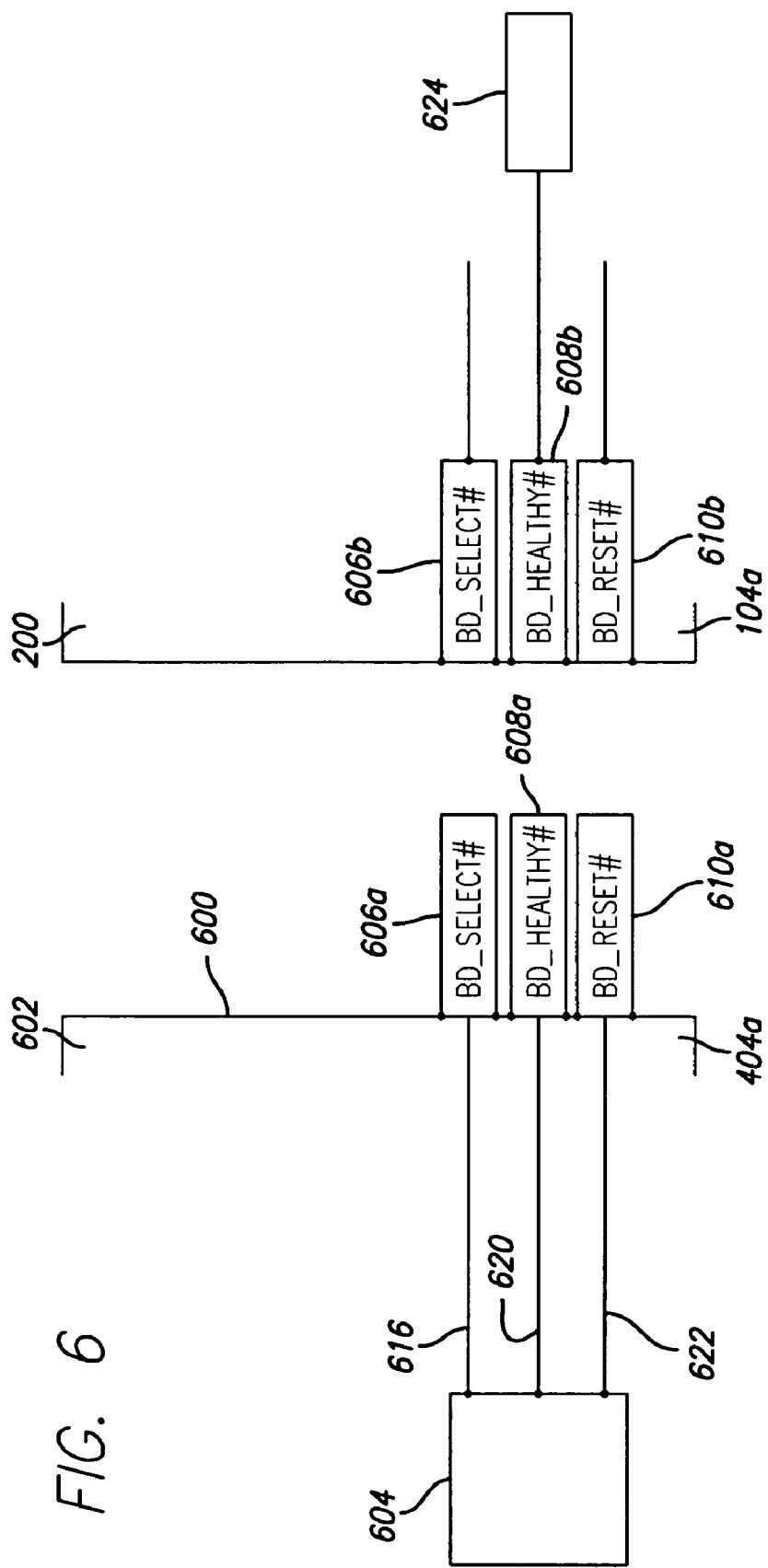
FIG. 6 shows a highly available (HA) CPCI system for determining whether a CPCI node card is faulty.

FIG. 6 illustrates a highly available (HA) CPCI system having a hardware signal for determining whether a front card is faulty. Referring to FIG. 6, a CPCI backplane 600 has a connector 404a in a slot 602, and a controller 604 coupled to the backplane 600. The connector 404a has the BD_SELECT# 606a, BD_HEALTHY# 608a, and BD_RESET# 610a connector-pins, which are of male-type, coupled to controller 604. A front card 200 has corresponding BD_SELECT# 606b, BD_HEALTHY# 608b, and BD_RESET# 610b connector-pins, which are of female-type. The BD_SELECT# line 616 is an input/output line and is defined to provide a signal to the controller 604 such that the controller 604 knows whether a hot swappable front card has been inserted in a particular slot. Further, the controller 604 performs the powering up/down of the front card 200 using this line 616. The BD_HEALTHY# pin 608b is connected to an internal power supply 624 in the front card 200. The BD_HEALTHY# line 620 is a controller input line and is used to indicate to the controller 604 whether or not the front card 200 is defective. This determination is made by sensing the voltage level from the internal power supply 624. The BD_RESET# line 622 is an input/output line and is used by the controller 604 to reset the front card 200 if it is to remain in a backup mode.

Figure 7:
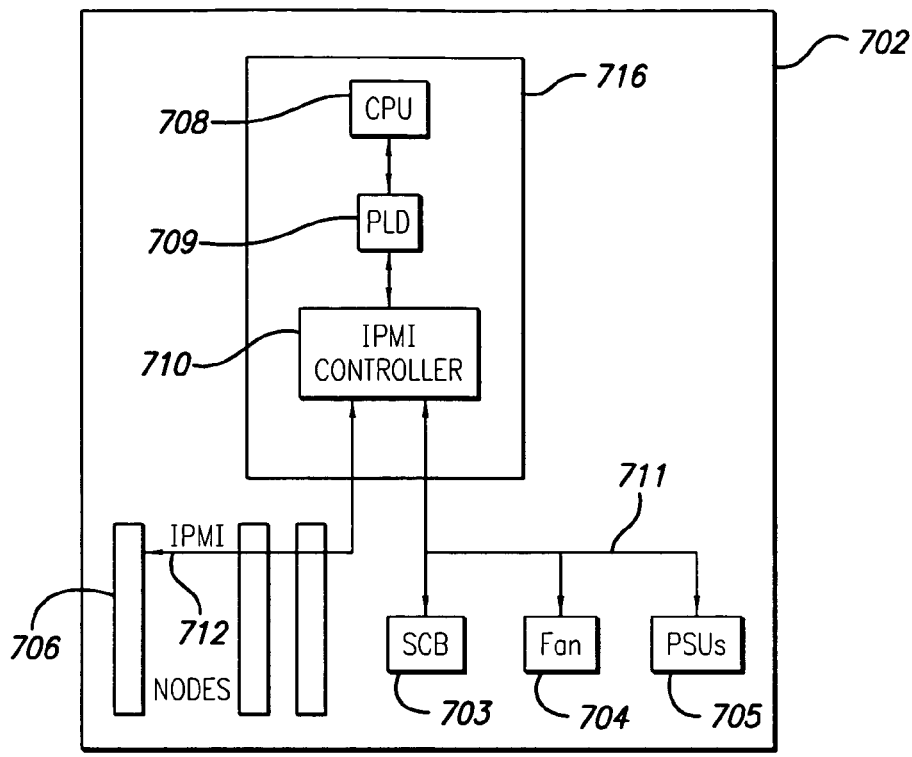
FIG. 7 shows a block diagram that illustrates a CPCI system that includes a host card and a host CPU according to an exemplary embodiment.

Referring to FIG. 7, there is shown an exemplary CPCI system 702 comprising a CPCI backplane or midplane (not shown), a plurality of node cards (or front cards or blades) 706, a host node card 716, a switch card (not shown), power supplies 705, fans 704, and a system control board (SCB) 703. The host node card 716 (or CPU card or CPU node board) includes a central processing unit (CPU) 708 to provide the on-board intelligence for the host node card 716. The CPU 708 of the host node card 716 is coupled to memories (not shown) containing firmware and/or software that runs on the host node card 716, Intelligent Platform Management Interface (IPMI) controller 710, and other devices, such as a programmable logic device (PLD) 709 for interfacing an IPMI controller 710 with the CPU 708. The SCB 703 provides the control and status of the system 702, such as monitoring the healthy status of all the power supplies 705 and the fans 704 (FRUs), powering ON and OFF the FRUs, etc. The SCB 703 is interfaced with the host node card 716 via an I2C interface 711 so that the host node card 716 can access and control the FRUs in the system 702. The fans 704 provide the cooling to the entire system 702. Each of the fans 704 has a fan board which provides control and status information about the fans and, like the SCB 703, are also controlled by the host node card 716 through the Inter Integrated Circuit (I2C) interface 711. The power supplies 705 provide the required power for the entire system 702. The node card 716 manages the power supplies 705 through the I2C 711 (e.g., the host node card 716 determines the status of the power supplies 705 and can power the power supplies 705 ON and OFF). The other node cards 706 are independent computing nodes and the host node card 716 manages these other node cards 706 though the IPMI or IPMB 712.

In addition, the IPMI controller 710 has its own processing core unit and runs the IPMI protocol over the IPMB 712 to perform the management of the computing node cards 706. IPMI Controller 710 is also the central unit (or point) for the management of the system 702. The CPU 708 of the host node card 716 can control the IPMI controller 710 and retrieve the system 702 status information by interfacing with the IPMI controller 710 via PLD 709. The IPMI controller 710 provides the host node card 716 with the IPMB 712 (the IPMB then connects with the "intelligent FRUs," such as node cards and switch fabric card) and the I2C 711 (the I2C interface 711 then connects with the "other FRUs," such as fans, power supplies, and the SCB).

Figure 8:
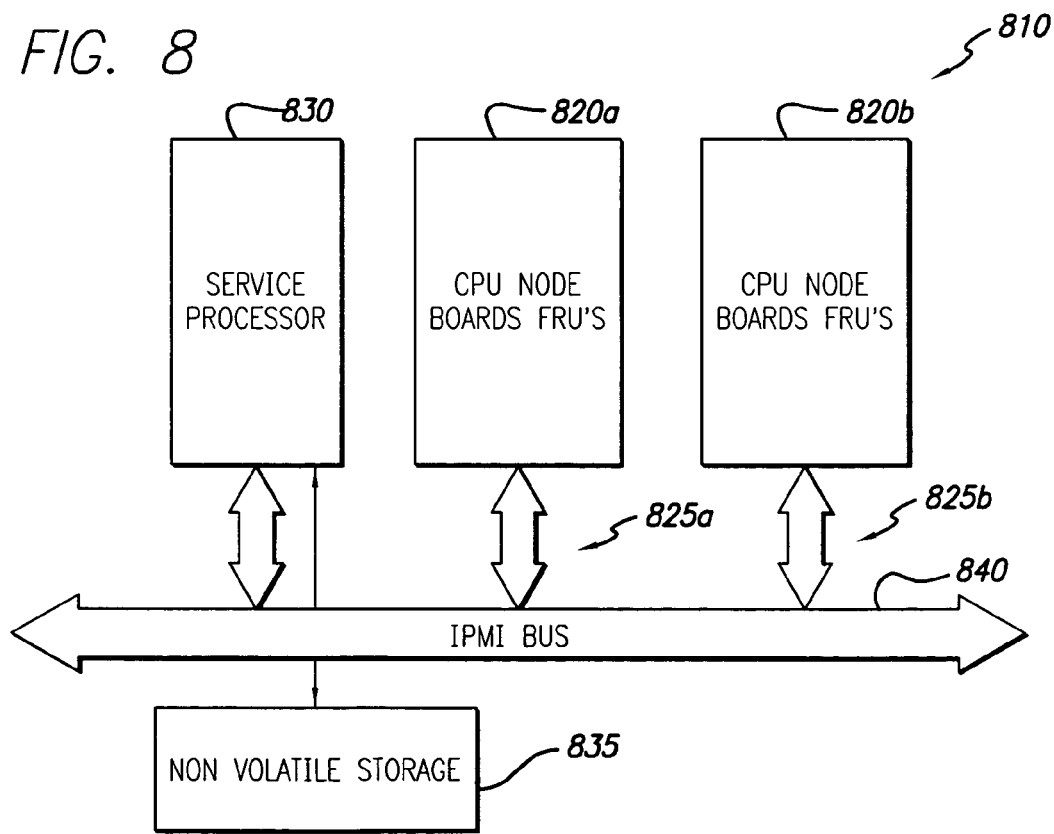
FIG. 8 shows a block diagram of an exemplary embodiment of a computer system.

FIG. 8 provides an exemplary embodiment of a networked computer system, indicated generally at 810, that utilizes the persistent power mask of the present disclosure. Computer system 810 contains several FRUs 820. FRU 820 may be any component in the system that can be replaced in the field in the event of a failure. For example, FRU 820 may be a CPU node board, a CPCI card, a front card, a node card, a power supply or any other similar device. FRU 820 may be connected to computer system 810 via holder or slot 825. For example, if FRU 820 is a CPCI card, slot 825 may be a CPCI slot.

Computer system 810 also includes a central resource 830. In one exemplary embodiment, central resource 830 is a service processor. Generally, central resource or service processor 830 is used to configure and manage computer system 810. Service processor 830 may be an alarm card, for example. Computer system 810 includes a hotswap controller (e.g., 604 in FIG. 6). The hotswap controller is any software/hardware entity that can make the determination as to whether to power on an FRU 820. The hotswap controller may run on service processor 830. Computer system 810 also includes management software that may manage the system and monitor the system for faults. The management software may also be run on service processor 830.

Service processor 830 may access storage 835. Storage 835 is preferably any non-volatile memory or storage device. For example, storage 835 may be a non-volatile midplane storage device, a midplane FRU, or a midplane electrically erasable programmable read-only memory (EEPROM). The components of computer system 810, including FRU 820 and service processor 830, are connected to bus 840. Bus 840 may be an Intelligent Platform Management Interface (IPMI) protocol bus, for example.

The central resource 830, e.g., service processor or alarm card, may generate or prepare a power mask for each slot 825. The power mask includes information regarding the power state or power status of slot 825 and may be based on a number of parameters or conditions. For example, the power mask may include the power state status and history of slot 825 as well as the functional status or power requirements of an FRU 820 attached to slot 825. As discussed above, because it is desirable to keep a faulty device or a device that requires too much power in a powered off state, these factors may be taken into account when generating or updating the power mask. The power state information may be accessed using the IPMI protocol. For example, the power state information may be expressed in 8-bits of data.

Once generated, the power mask and associated power state information are then stored in storage 835. Other information, such as system information, may also be stored in storage 835 for purposes of determining or controlling the power state of FRU 820. Because the power mask is placed in storage 835, it is available even after a power cycle. The power mask may be subsequently accessed by service processor 830 or system software agents. For example, the hotswap controller may access the power mask to determine the power state status and history of slot 825. Management software may also access the power mask information to update the information depending on the condition of FRU 820 or other predetermined parameters. Depending on the power mask, service processor 830 may power on FRU 820 or leave FRU 820 powered off. Accordingly, a power mask may be maintained over several power cycles to control the power state of the network devices.

Figure 9:
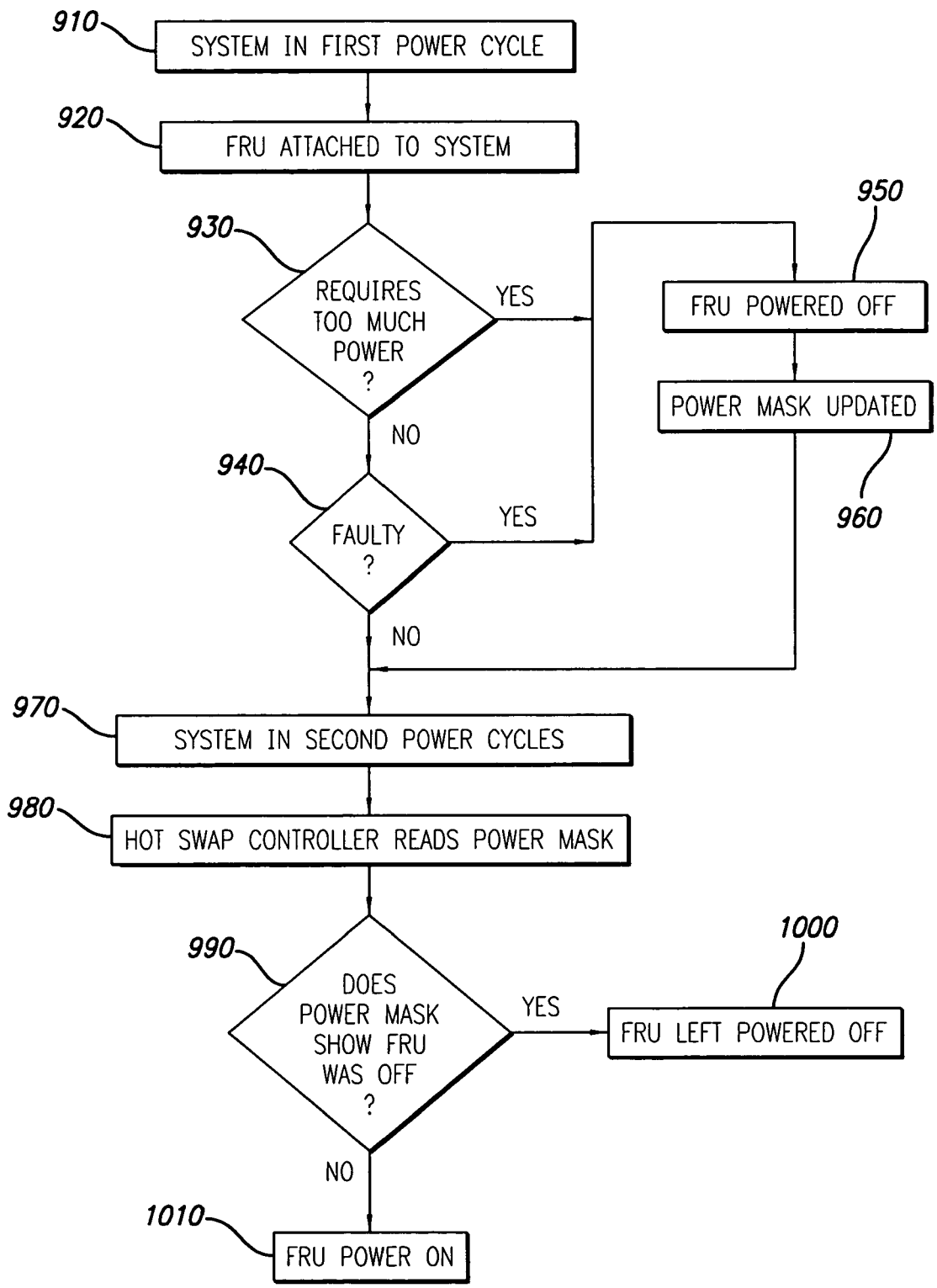
FIG. 9 shows a flow diagram of an exemplary embodiment of generating and utilizing a power mask.

FIG. 9 is a flowchart illustrating an exemplary embodiment of the method for generating and utilizing a persistent power mask to determine the power state of a network device. Initially, at step 910, the system is in a first power cycle. At step 920, a network device, such as FRU 820, for example, is attached to the system. Once a new FRU 820 is detected, the service processor 830 may determine whether the device should be powered off or allowed to be powered on. Alternatively, service processor 830 may periodically check all attached devices, not just recently detected devices.

As discussed above, the system may define a number of conditions or parameters to determine whether a device should be powered on or powered off. For example, at step 930, service processor 830 determines whether FRU 820 requires more power than the system can provide. Each FRU 820 may have power requirement information stored in its non-volatile memory. This non-volatile memory may be powered by standby power. As discussed above, when the FRU 820 is inserted, its power requirements may be collected through IPMI protocol. The hotswap controller determines whether FRU 820 requires an excessive amount of power by comparing the power requirements of the device with the system power capacity. For example, a simple algorithm may be used to provide that the sum of all power requirements of the attached devices should not exceed the total power capacity of the system. The power mask may also contain the maximum power allocated per slot 825 by the system. If a device, e.g., FRU 820, with a power requirement greater than that allocated for slot 825 is inserted, then this device will not be powered on and will be marked as such in the power mask; e.g., this power status information will be stored in storage 835 so that this device will not get powered on if the system is power cycled.

Another basis for powering a device off is that the device is faulty or malfunctioning. For example, at step 940, the system may determine whether FRU 820 is faulty. Device fault may be determined by a hardware signal #HEALTHY, for example. The hotswap controller may determine whether the device is faulty using this #HEALTHY hardware signal. If it is determined at step 930 that FRU 820 requires too much power or, at step 940, that FRU 820 is faulty, then FRU 820 is powered off at step 950. The power mask is subsequently updated at step 960 to reflect this power status. As discussed above, management software can access the power mask in storage 835 to update and modify the power mask to indicate that FRU 820 should be left powered off during the next power cycle. As discussed above, the system may define other conditions and parameters besides power consumption and faulty performance in determining whether to power a device off and keep the device powered off during subsequent power cycles.

At step 970, the system enters a second power cycle. Next, the hotswap controller reads or accesses the power mask and the power state information for each FRU 820 at step 980. It is then determined, at step 990, whether the power mask indicates that FRU 820 should be powered on at step 1010 or left powered off at step 1000. For example, if the power mask indicates that FRU 820a was powered off in the previous power cycle and FRU 820b was powered on, then the system will keep FRU 820a powered off and will power on FRU 820b. Accordingly, devices that are faulty, require too much power, or otherwise fail to meet system requirements may be kept powered off in a subsequent power cycle in order to preserve the performance of the system.

Having described the preferred embodiments of the system and method for providing a persistent power mask, it should be apparent to those skilled in the art that certain advantages of the described system and method have been achieved. It should also be appreciated that various modifications, adaptations and alternative embodiments thereof may be made within the scope and spirit of the present invention.

The invention claimed is:

1. A computer network system, comprising:
   a circuit board forming a backplane;
   a field replaceable unit (FRU) slot located on said backplane;
   a bus;
   a central resource coupled with said FRU slot via said bus; and
   a non-volatile memory coupled to said central resource;
   wherein said central resource is configured to generate a power mask for said FRU slot;
   wherein said power mask is configured to be stored in said non-volatile memory; and
   wherein said power mask includes a power state of said FRU slot.

2. The computer network system of claim 1, wherein said FRU slot comprises a Compact Peripheral Component Interconnect (CPCI) slot.

3. The computer network system of claim 1, wherein said power mask is configured to be available after a power cycle and is configured to be subsequently accessed from said non-volatile memory by said central resource via said bus.

4. The computer network system of claim 3, wherein said central resource is configured to access said power mask for information regarding said power state on said power mask using an Intelligent Platform Management Interface (IPMI) protocol.

5. The computer network system of claim 1, wherein said central resource is configured to access said power mask from said non-volatile memory to determine a power status and history of said slot.

6. The computer network system of claim 1, wherein said power mask comprises a power status of said FRU slot and a functional status of an FRU held by said FRU slot.

7. The computer network system of claim 1, wherein said central resource is configured to access said power mask from said non-volatile memory to update said power state.

8. The computer network system of claim 7, wherein said updated power state depends on a condition of an FRU held by said FRU slot.

9. The computer network system of claim 1, wherein said central resource is configured to access said power mask from said non-volatile memory to determine whether an FRU held by said FRU slot is faulty.

10. The computer network system of claim 1, wherein said central resource is configured to access said power mask from said non-volatile memory to determine whether an FRU held by said FRU slot requires too much power.

11. The computer network system of claim 1, wherein said central resource is configured to generate said power mask based on whether an FRU held by said FRU slot requires too much power.

12. The computer network system of claim 1, wherein said central resource is configured to access said power mask from said non-volatile memory to keep an FRU held by said FRU slot in a powered off state.

13. The computer network system of claim 1, further comprising a hotswap controller configured to run on said central resource and wherein said hotswap controller is configured to make a determination as to whether to power on an FRU held by said FRU slot.

14. The computer network system of claim 13, wherein said hotswap controller is configured to persistently power down said FRU when said FRU requires an excess amount of power.

15. The computer network system of claim 13, wherein said hotswap controller is configured to persistently power down said FRU when a hardware signal from said FRU indicates said FRU as being faulty.

16. The computer network system of claim 1, further comprising a second FRU slot located on said backplane and wherein said central resource is configured to generate a second power mask for said second FRU slot.

17. The computer network system of claim 16,
wherein said power mask is uniquely generated by said central resource for said FRU slot and said second power mask is uniquely generated by said central resource for said second FRU slot and
wherein both said power mask and said second power mask are persistently stored in said non-volatile memory.

18. The computer network system of claim 1,
wherein said FRU slot is a first FRU slot;
wherein the system further comprises a second FRU slot;
wherein the central resource is further operable to store a separate power mask for each of the first and second FRU slots; and
wherein each separate power mask includes an indicator specific to said power mask's FRU slot which indicates whether said respective FRU should be powered on or powered off.

19. The computer network system of claim 1, wherein said central resource is further operable to generate an indicator in the power mask which indicates whether an FRU held by said FRU slot is faulty.

20. A method for generating and utilizing a persistent power mask to determine a power state of a computer network device, comprising:
   determining by a central resource whether a field replaceable unit (FRU) coupled to a computer network system should be powered off during a first power cycle of said computer network system;
   generating a power masks by said central resource for said FRU, with an indicator of a power state which indicates whether said FRU should be powered on or powered off;
   storing said power mask in a non-volatile memory;
   accessing said power mask by said central resource from said non-volatile memory during a second power cycle of said computer network system; and
   utilizing said power mask by said central resource to determine whether said FRU should be persistently powered off during said second power cycle.

21. The method of claim 20, wherein said determining by said central resource as to whether said FRU should be powered off comprises:
   determining by said central resource whether said FRU requires more power than said computer network system can provide.

22. The method of claim 21, wherein said determining by said central resource as to whether said FRU requires more power than said computer network system can provide comprises:
   comparing a power requirement of said FRU with a power capacity of said computer network system,
   wherein said power requirement of said FRU is stored in a second non-volatile memory located within said FRU and wherein said second non-volatile memory is powered on by a standby power source of said computer network system.

23. The method of claim 20, wherein said determining by said central resource as to whether said FRU should be powered off comprises:
   determining by said central resource whether said FRU is faulty.

24. The method of claim 20, further comprising:
   determining by said central resource whether said FRU coupled to said computer network system should be powered on during said second power cycle of said computer network system; and
   updating said power mask by said central resource for said FRU to reflect an updated power status determined by said central resource for said FRU during said second power cycle.

25. The computer network system of claim 20, wherein the indicator indicates whether said FRU was powered on or powered off prior to a last system power down.

* * * * *